(12) United States Patent  
Frost et al.

(10) Patent No.: US 6,637,446 B2
(45) Date of Patent: Oct. 28, 2003

(54) INTEGRATED SUBSTRATE PROCESSING SYSTEM

(75) Inventors: David T. Frost, San Jose, CA (US); Oliver David Jones, Watsonville, CA (US); Mike Wallis, Corralitos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/211,714

(22) Filed: Aug. 1, 2002

(65) Prior Publication Data

US 2002/0184720 A1 Dec. 12, 2002

Related U.S. Application Data

(63) Continuation of application No. 09/540,421, filed on Mar. 31, 2000, now Pat. No. 6,457,199.

(51) Int. Cl.⁷ ................................................. B08B 3/12
(52) U.S. Cl. .......................... 134/184; 134/63; 134/76; 134/902
(58) Field of Search .............................. 134/1.3, 61, 63, 134/76, 135, 184, 702

(56) References Cited

U.S. PATENT DOCUMENTS

| | | | |
|---|---|---|---|
| 4,924,890 A | 5/1990 | Giles et al. ................... 134/61 |
| 5,485,644 A | 1/1996 | Sinbara et al. ............... 15/21.1 |
| 5,518,542 A | 5/1996 | Matsukawa et al. .......... 118/52 |
| 5,893,381 A | 4/1999 | Terui ............................. 134/6 |
| 5,927,302 A | * 7/1999 | Hayami et al. ............... 134/89 |
| 5,950,327 A | 9/1999 | Peterson et al. .............. 34/328 |
| 6,027,262 A | 2/2000 | Akimoto ..................... 396/611 |
| 6,051,101 A | 4/2000 | Ohtani et al. .......... 156/345.32 |
| 6,112,355 A | 9/2000 | Tsuchida et al. ............... 15/77 |
| 6,358,128 B1 | 3/2002 | Sakurai et al. ................ 457/67 |
| 6,358,325 B1 | 3/2002 | Andreas ........................ 134/2 |
| 2002/0066472 A1 | * 6/2002 | Sonoda et al. ................ 134/32 |

\* cited by examiner

*Primary Examiner*—Randy Gulakowski
*Assistant Examiner*—Joseph Perrin
(74) *Attorney, Agent, or Firm*—Martine & Penilla, LLP

(57) ABSTRACT

A system and methods for substrate preparation are provided. In one example, a wafer processing system includes a system enclosure that contains wafer processing apparatus within an isolated wafer processing environment. The wafer processing apparatus include a pair of immersion tanks in the lower front region of the system with a pair of wafer pickers behind the immersion tanks to extract wafers from the tanks. In the rear of the system, a pair of brush boxes are located in a lower region with a pair of dryer units positioned above the brush boxes. A robot arm is positioned between the pair of immersion tanks and the pair of brush boxes in a middle region of the system, and is configured to transition wafers between the processing apparatus. A pair of output shelves holding output cassettes is positioned over the immersion tanks. The output cassettes receive clean wafers after processing.

7 Claims, 15 Drawing Sheets

INTEGRATED SUBSTRATE PROCESSING SYSTEM

CROSS REFERENCE TO RELATED APPLICATIONS

This application is a continuation of U.S. patent application Ser. No. 09/540,421, filed on Mar. 31, 2000, now U.S. Pat. No. 6,457,199 and entitled "WAFER PREPARATION SYSTEMS AND METHODS FOR PREPARING WAFERS." This cross referenced application is hereby incorporated by reference.

BACKGROUND OF THE INVENTION

1. Field of the Invention

The present invention relates generally to the preparation of substrates such as those used in semiconductor fabrication as well as in the manufacture of hard disk drives, and more particularly to the cleaning and drying of substrates using space- and process-efficient systems.

2. Description of the Related Art

In the fabrication of semiconductor devices, there is a need to perform a variety of substrate preparation operations including chemical mechanical polishing (CMP) operations and substrate cleaning. By way of example, integrated circuit devices are commonly fabricated as multi-level structures. Planarization, polishing, and cleaning operations are typically performed on semiconductor wafers at various stages in the fabrication process to maintain a smooth and constant topography, as well as to remove excess metallization during the process of forming metal line patterns throughout the wafer. In the fabrication of hard disk drives, planarization and cleaning operations are needed to maintain a clean and smooth disk substrate.

Typical substrate cleaning, polishing and planarization techniques can include the independent processes of immersion and preparation of a substrate using a megasonic apparatus, followed by scrubbing, buffing, polishing, or other such operations using a scrubbing or polishing apparatus, and a rinse and dry operation using a spin, rinse and dry (SRD) apparatus. Such processes are often repeated a plurality of times, interspersed at various stages of substrate preparation and fabrication.

In the prior art, substrate cleaning systems typically implement brush stations in which polyvinyl alcohol (PVA) brushes are used to scrub both sides of a substrate. The PVA brush material is configured to be soft enough to prevent damage to the substrate's delicate surface, yet can provide good mechanical contact with the substrate surface to dislodge residues, chemicals and particulates. In some applications, the process is enhanced by performing a megasonic preparation process on a substrate prior to processing the substrate through such a cleaning system. In the megasonic processing, a cassette of substrates is typically immersed in a tank and subjected to megasonic energy to loosen, soften, dislodge, or otherwise enhance the removal of residues, chemicals and particulates in the cleaning system. Following a megasonic processing, a cassette of substrates is then commonly transported to a cleaning system for continued substrate preparation.

Each of the brushes in a cleaning system are typically configured to deliver chemicals and or DI water through the brush (TTB). Two brush stations are often used, each with a pair of brushes, to enable the application of chemicals in one brush station and DI water in the other. This dual brush station approach has been shown to improve the cleaning performance as well as increase throughput. One physical layout of the cleaning system is to arrange the brush stations longitudinally (i.e., horizontally). The substrate therefore travels from one brush station to the next along a conveying system.

Once the substrate has been processed in both brush stations, the substrate is then transported to a next station in which the substrate is subjected to an SRD operation, which is performed in an SRD station or dryer station.

Each of the megasonic processing, scrubbing, polishing, buffing, or cleaning processing, and SRD processing is typically accomplished by separate apparatus or machines, and often arranged sequentially or in close proximity to perform sequential processing operations. Where these substrate processing stations are arranged horizontally, the machine or machines necessarily occupy a large clean room footprint. In some systems, a single machine footprint can be as long as 6–7 feet by 3 feet wide.

The footprint of a cleaning system is significantly reduced when the preparation systems are arranged in a vertical orientation. The vertical arrangement results in reduced costs of manufacture by reducing the footprint of preparation systems and requiring less clean room floor space.

In some substrate fabrication operations, the combination of megasonic preparation with scrub, polish, buff, or clean operations, and followed by a SRD process is a most preferred process. Because of stringent cleanliness requirements, transfer between preparation stations must be minimized, and the preparation environment must meet exacting specifications. Further, economy of process and the demands of output necessitate batch processing of substrates whenever possible.

In view of the foregoing, there is a need for substrate preparation systems and methods that are more compact, occupy smaller clean room footprints, provide for more efficient and higher throughput substrate preparation operations (e.g., such as cleaning, etching, drying and the like), allow for multiple scrub, polish, buff, or clean operations and maintain stringent clean room specification requirements. These substrate preparation systems and methods should therefore be configured to avoid the problems of the prior art.

SUMMARY OF THE INVENTION

Broadly speaking, the present invention fills these needs by providing a system and method for substrate preparation that provides for batch preparation of substrates within a compact and efficiently designed system enclosure. The present invention can be implemented in numerous ways, including as a process, an apparatus, a system, a device, or a method. Several inventive embodiments of the present invention are described below.

In one embodiment, a substrate preparation system is disclosed. The substrate preparation system includes an immersion in a lower front of the system that is configured to receive a cassette of substrates for megasonic processing. The substrate preparation further includes a brush box unit in a lower back end of the system, and a dryer unit is positioned over the brush box unit. A robot arm is positioned between the immersion tank and the brush box and dryer units, and is configured to transport substrates from the immersion tank to the brush box, and from the brush box to the dryer unit. The substrate preparation system is configured to contain the immersion tank, the brush box unit, the dryer unit and the robot arm within the substrate preparation system.

In another embodiment, a method for preparing a substrate is disclosed. The method includes providing a batch of substrates, and immersing the batch of substrates in an immersion tank. The method further includes the processing of the substrates following immersion to include transitioning of a substrate from the immersion tank to a first brushing station, transitioning the substrate from the first brushing station to a second brushing station, transitioning the substrate from the second brushing station to an drying station, and transitioning the substrate from the drying station to a clean output cassette. The method provides for continuous and successive substrate processing for a desired number of batches of cassettes.

In still a further embodiment, a wafer processing system is disclosed. The wafer processing system includes a system enclosure containing wafer processing apparatus within an isolated wafer processing environment. The wafer processing system further includes a pair of immersion tanks in the lower front of the system that are configured to process wafers in a fluid bath, a pair of wafer pickers to extract wafers from the fluid bath, a robot arm behind the immersion tanks that transitions wafers from the wafer pickers across the system enclosure, a pair of brush boxes in the lower back region of the system that scrub substrates received from the robot, a pair of dryer units above the brush boxes that receive wafers from the robot after the robot extracts the wafers from the brush boxes, and a pair of output shelves located in the upper front region of the system enclosure above the pair of immersion tanks, the output shelves supporting output cassettes which receive wafers from the robot after the wafers have been processed in the dryer units.

The advantages of the present invention are numerous. One notable benefit and advantage of the invention is that a plurality of substrate preparation operations can be accomplished within a single, compact, and efficient system. The system maintains an isolated, clean environment which minimizes substrate exposure to or risk of contamination while transitioning between the plurality of process operations. The efficient arrangement of the process apparatus allows for minimal transfer distance between process apparatus.

Another benefit is the incorporation of megasonic processing in one embodiment. After immersing substrates in a liquid bath being of some chemical or water composition in one or both immersion tanks, the substrates are then subjected to megasonic energy. This processing is configured to loosen, soften, dislodge, or otherwise enhance the removal of residues, chemicals and particulates from substrates in the subsequent scrubbing, cleaning, polishing, buffing, or other such process.

Another benefit is the substrate processing apparatus assembled within the system enclosure. The system provides for multiple batch processing of wafers resulting in increased throughput of substrates and decreased time required for substrate fabrication and preparation.

Yet another benefit is the efficient arrangement of the system apparatus. The disclosed system units can be assembled in modular combinations, and the illustrated embodiments of the vertically arranged dryer units over brush boxes, output shelves over immersion tanks, and transfer robot provide a self-contained class 1 clean room environment within a system enclosure that requires much less fab and clean room floor space than in the prior art. This both maximizes the cleanliness of the substrate processing environment, and reduces the cost of fabrication and processing by requiring less floor space.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention providing a system and methods for substrate processing is disclosed. In preferred embodiments, the substrate processing system includes a system enclosure that maintains an isolated processing environment and includes within the system enclosure multiple processing apparatus for batch processing of substrates. In one embodiment, a method is disclosed to batch process substrates through the plurality of processing apparatus. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
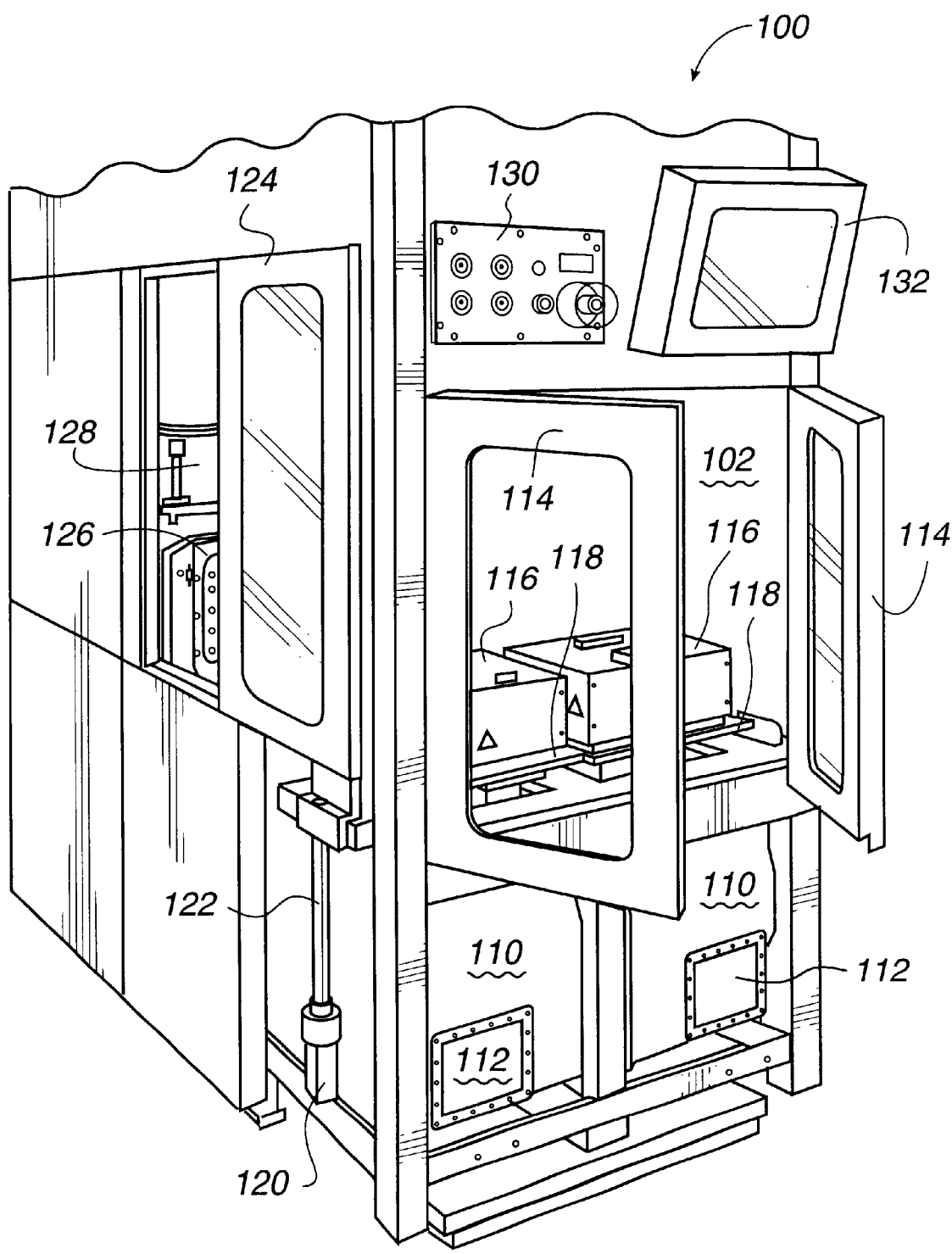
FIG. 1 shows a modular substrate preparation system in accordance with one embodiment of the present invention.

FIG. 1 shows a modular substrate preparation system 100 in accordance with one embodiment of the present invention. The individual stations, described in greater detail below, are arranged within a system enclosure 102 that maintains an isolated, clean environment during substrate processing. The individual preparation stations maintain a processing environment within each unit, and the ambient environment between the stations through which substrates are moved is maintained in accordance with clean room specifications within the system enclosure 102. Access to the ambient environment within the system enclosure 102 is provided through doors 114 on the front of the modular system 100, and side access doors 124 on the sides of the modular system 100. In one embodiment, the doors 114, 124 are configured to both maintain the ambient environment within the system enclosure 102 during substrate processing, and to halt system processing when opened.

A feature of the present invention is the ambient environment maintained within the system enclosure 102. In one embodiment, the ambient environment is rated at Class 1 of a clean room specification. The ambient environment is generally maintained with laminar air flow from the upper region of the modular system 100 downward and exhausting through the bottom or lower region (not shown in FIG. 1). HEPA or ULPA filtration located in the upper region of the modular system 100 meets or exceeds clean room specification for particulate filtration, and the laminar flow downward provides for an ambient environment that can both meet Class 1 requirements within the system enclosure 102, and create an environment that is progressively cleaner from lower to upper regions within the system enclosure 102. In one embodiment, the progressive cleanliness is exploited for optimum substrate processing.

In the illustrated embodiment, the modular substrate processing system includes two immersion tanks 110 in a lower, front region of the substrate processing system 100, and two output shelves 118 configured above the immersion tanks 110. In the rear of the system 100 are two cleaning, buffing, polishing, or other such units hereinafter referred to as brush boxes 126, and two dryer units 128 mounted above the brush boxes 126. A control panel 130 provides control and indication of various system 100 operations, and a system monitor 132 provides integrated access, control, and indication of substrate processing and system 100 operations.

Windows 112 are shown in a lower region of immersion tanks 110. In one embodiment, the immersion tanks 110 include megasonic elements for megasonic processing of substrates. The windows 112 shown in FIG. 1 allow for access to megasonic elements, plumbing fixtures, and other structures of the immersion tanks 110.

A stepper motor 120 is shown in a front, lower, side region of the modular substrate processing system 100. In one embodiment of the present invention, the stepper motor 120 and shaft 122 control the raising and lowering of output shelves 118. The output shelves 118 (shown with bases 116 mounted thereon) travel along track 119 between a lowered position immediately over immersion tanks 110 as illustrated in FIG. 1, and a raised position (not shown).

Figure 2:
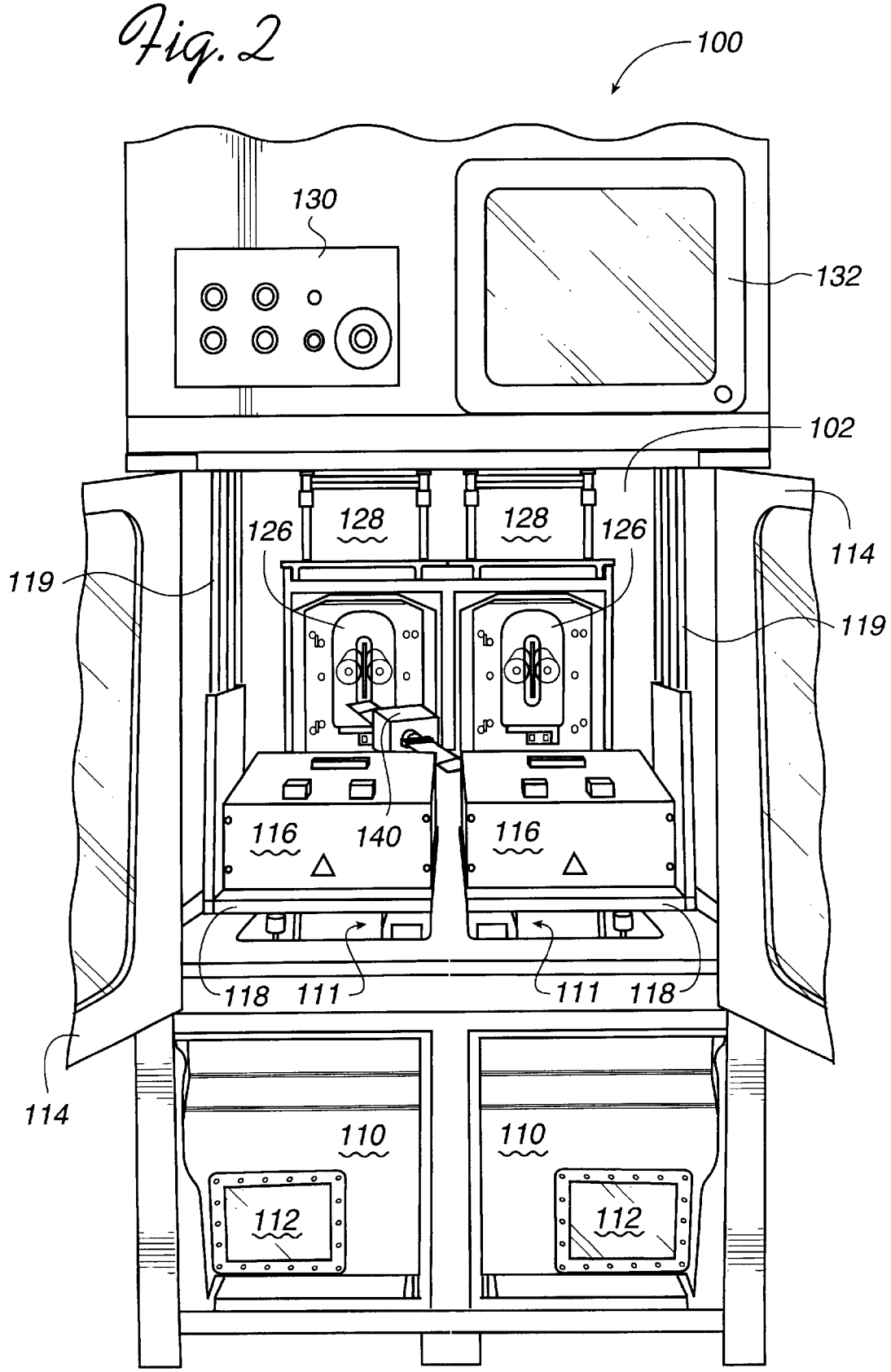
FIG. 2 is another perspective of the modular substrate preparation system shown in FIG. 1.

FIG. 2 is another perspective of the modular substrate preparation system 100 shown in FIG. 1. Doors 114 are shown in an open position. Immersion tanks 110 with windows 112 are shown in a lower region of the front of the system. Output shelves 118 are over the immersion tanks 110 in a lowered position with bases 116 mounted thereon. On an outer side, a side toward the exterior of the system 100, of either output shelf 118 is a track 119 along which the output shelf 118 travels between the lowered position as illustrated, and a raised position (not shown). Directly beneath the output shelves 118 are tank openings 111. When the output shelves 118 are in the raised position, the tank opening 111 is unobstructed, allowing for the placement of substrate cassettes to be lowered into the tanks 110, and the subsequent extraction of substrates, one-at-a-time, from the cassettes immersed in the tanks for processing.

A base 116 is shown positioned on each output shelf 118. Each base is configured to support a cassette on a top surface. The cassette (not shown in FIG. 2) is oriented to receive substrates in a horizontal orientation. As will be described in greater detail below, in one embodiment of the invention substrates are extracted from one of the two dryer units 128, transported across the interior of the system enclosure 102, and inserted in a cassette mounted on one of the two bases 116 which is positioned on one of the two output shelves 118 in a raised position. In another embodiment of the present invention, SMIF pods, also called SMIF boxes (see FIG. 9B) are positioned on the output shelves 118 to receive the clean substrates, and maintain an ultra-clean environment for the substrates after removal from the system 100. Each base 116 is configured to be of the same dimension as a SMIF pod so that either standard cassettes or SMIF pods can be used in accordance with embodiments of the invention.

In the rear of the system 100, two dryer units 128 are located in an upper region, side-by-side. Located below the dryer units 128 are two brush boxes 126. Each brush box 128 is configured with two opposing brushes 134 oriented to receive a substrate in a vertical orientation between the two brushes 134. Thus configured, the brushes 134 can scrub, polish, buff, or otherwise prepare a substrate with each brush 134 operating on an opposing surface of the substrate. An exemplary brush box 126 is described in U.S. Pat. No. 5,875,507, which is herein incorporated by reference.

Between the front of the system 100 having the immersion tanks 110 and the output shelves 118, and the rear of the system 100 having the brush boxes 126 and the dryer units 128, is a mechanical robot arm 140. The robot arm 140 is configured to transport substrates between the processing stations within the system enclosure 102.

Figure 3:
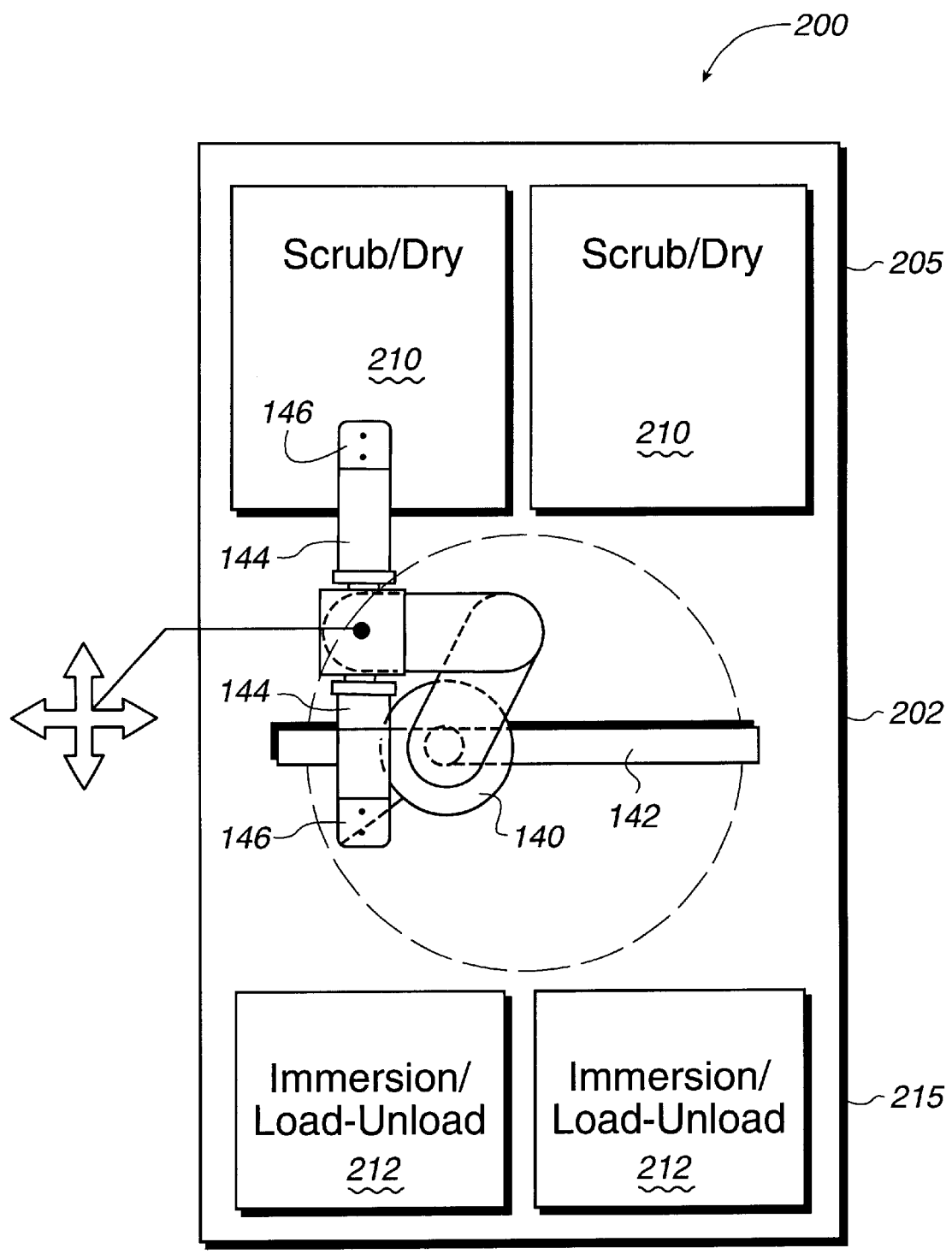
FIG. 3 shows a modular substrate preparation system diagram of one embodiment of the present invention.

FIG. 3 shows a modular substrate preparation system diagram 200 of one embodiment of the present invention. The modular substrate preparation system diagram 200 includes three subsystems. The scrub/dry subsystem 205 includes two adjacent scrub/dry blocks 210. The immersion/load-unload subsystem 215 includes two adjacent immersion/load-unload blocks 212. The robot subsystem 202 is in between the scrub/dry blocks 210 and the immersion/load-unload blocks 212, and contains the mechanical robot arm 140. The mechanical robot arm 140 includes two blades 144 extending in opposite directions from the mechanical robot arm 140, and each having an end effector 146 at its distal end. Each blade 144 is configured to pivot in order to position the end effector 146 in either a horizontal or a vertical orientation. Each end effector 146 is configured to be of an appropriate size and mechanism to manipulate the particular substrate to be processed in the system 100, and is readily exchanged to accommodate the particular substrates being processed. By way of example, substrates can be semiconductor wafers of various sizes, hard disk drives of various sizes with center apertures, and the like. The mechanical robot arm 140 is configured in a track 142, and the body of the mechanical robot arm 140 is constructed in rotatable and extendable segments (not shown in FIG. 3) enabling precise positioning of either end effector 146 to insert, extract, and transfer substrates between immersion/load-unload blocks 212 and scrub/dry blocks 210.

In one embodiment, each blade 144 is configured with a similar end effector 146, but dedicated to separate operations in order to maintain a "wet" end effector 146 and a "dry" end effector 146. By way of example, one end effector 146 is dedicated to be a dry end effector 146 and is used only for the operation of transitioning a substrate from a dryer unit to an output cassette (see FIGS. 10–16). Because the movement of the substrate is from a horizontal orientation in a dryer unit 128 to a horizontal orientation in an output cassette 158, the bade 144 need not be configured to rotate. The other end effector 146 is dedicated to be a wet end effector 146 whose blade 144 would necessarily rotate as substrates are transferred from brush box 126 to dryer 128, after having been transitioned to the brush box 126 from an immersion tank 110. The embodiment utilizing a wet and dry end effector eliminates cross contamination of wet and dry substrate handling.

Figure 4:
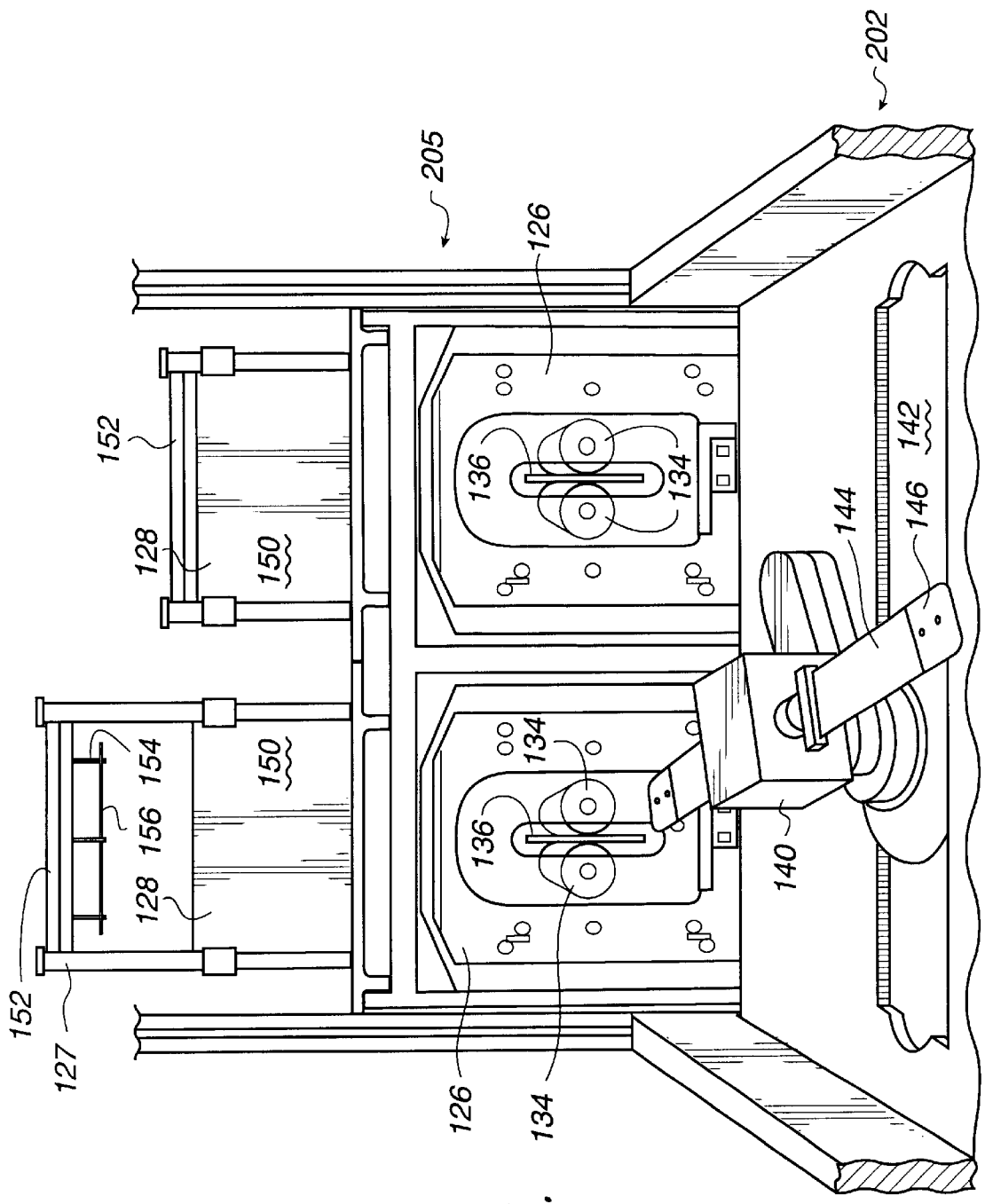
FIG. 4 shows a scrub/dry subsystem located behind a robot subsystem, in accordance with one embodiment of the present invention.

FIG. 4 shows the scrub/dry subsystem 205 behind the robot subsystem 202 in accordance with one embodiment of the present invention. In the illustrated embodiment, the scrub/dry subsystem 205 includes two brush boxes 126 positioned side-by-side, and two dryer units 128, also configured side-by-side, and located above the brush boxes 126. One of the dryer units 128 is illustrated in an open position. In order to insert a substrate into a dryer unit 128, the top lid 152 of the dryer unit 128 is raised away from the base 150 of the dryer unit 128 by extending lifts 127. Pins 154 are configured to support the substrate 156 in a horizontal orientation, and then the top lid 152 is lowered by the extending lifts 127 to mate with the base 150 of the dryer unit 128. Once the substrate 156 is positioned in the dryer unit 128 and the dryer unit 128 is securely closed, an SRD or other drying process is accomplished. An exemplary SRD apparatus is described in U.S. Pat. No. 5,778,554, which is herein incorporated by reference.

As is described in greater detail below, the mechanical robot arm 140 inserts a wafer into a brush box 126 with an end effector 146. The blade 144 positions the end effector 146 and substrate in a vertical orientation. The mechanical robot arm 140 is positioned along track 142 to align the end effector 146 and substrate with slot 136 in one of the two brush boxes 126. The mechanical robot arm 140 then inserts the substrate into slot 136 and between brushes 134. The blade 144 and end effector 146 are then withdrawn from the brush box 126, a door (not shown) closes the slot 136, and the substrate is scrubbed, polished, buffed, cleaned, or otherwise processed.

In one embodiment, the processing of a substrate includes two distinct preparation operations using different liquids of different chemistries in the two brush boxes 126. By way of example, a first substrate preparation process may include an abrasive slurry or a chemical solution, followed by a second preparation process including a weaker chemical solution or a first rinse. In such an embodiment, a substrate is inserted into a first brush box 126 for a first preparation process, and then removed from the first brush box 126 and inserted into a second brush box 126 for a second preparation process. In the illustrated configuration, the robot 140 inserts the substrate into one of the two brush boxes 126 for the first preparation process, and then removes, transports, and inserts the substrate into the other brush box 126 for the second preparation process. At the completion of the second preparation process, the robot 140 removes the substrate from the second brush box 126, raises it to the level of the dryer units 128, rotates the substrate into a horizontal orientation, and then inserts the substrate into one of the two dryer units 128. The embodiment and process is further described below in reference to FIGS. 10–16.

Figure 5A:
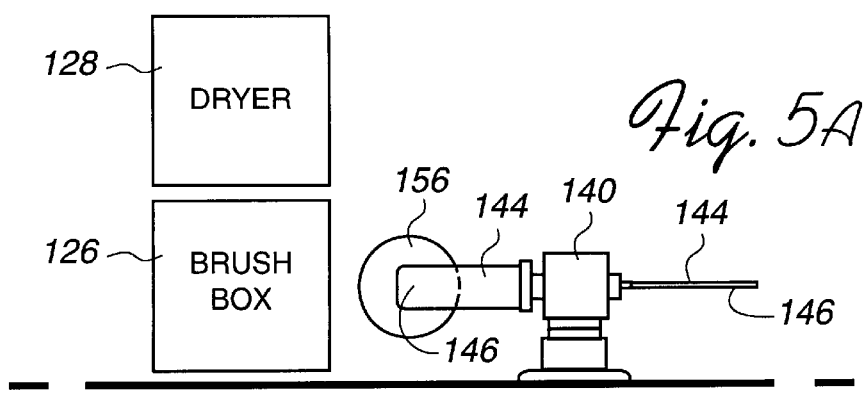
FIGS. 5A through 5C show the transfer of a substrate between the brush boxes, the dryer unit, and the output cassette in accordance with one embodiment of the present invention.
Figure 5B:
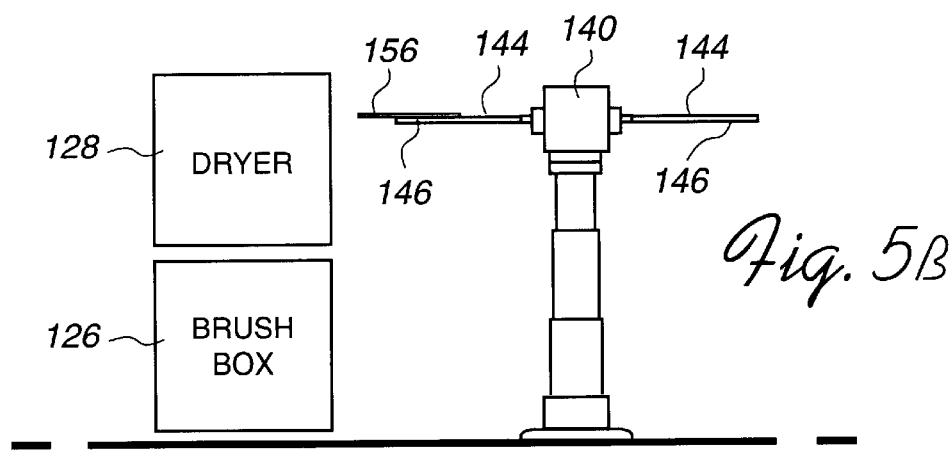
Figure 5C:
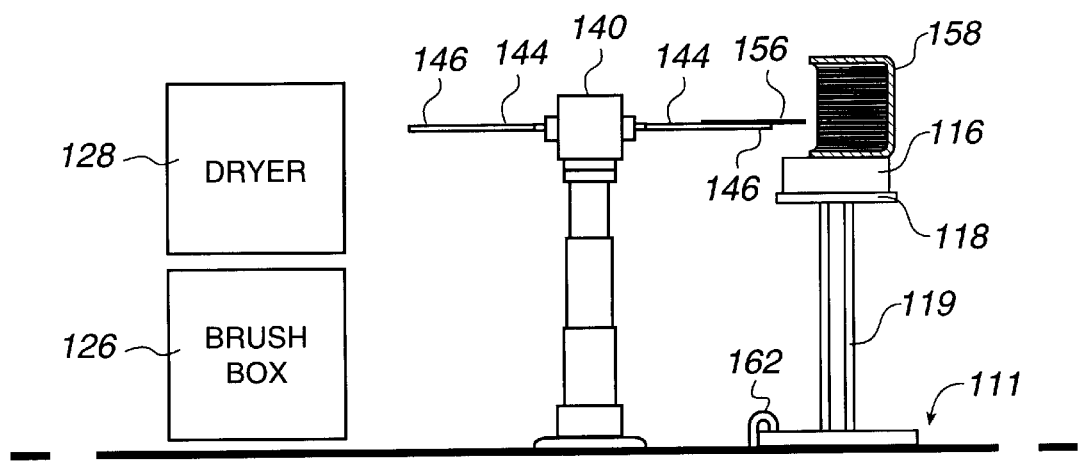

FIGS. 5A through 5C show the transfer of a substrate between the brush boxes 126, the dryer unit 128, and the output cassette 158 in accordance with one embodiment of the present invention. In FIG. 5A, the robot 140 inserts a substrate 156 into and extracts a substrate 156 from the brush boxes 126. The blade 144 and end effector 146 are in a vertical orientation to align the substrate 156 with the vertically oriented brush boxes 126. Using the previously described track 142 (FIG. 4) and rotatable segments, the robot 140 can align with either of the two side-by-side brush boxes 126.

In FIG. 5B, the robot 140 is shown extended to the level of the dryers 128, and the blade 144 has pivoted the end effector 146 and substrate 156 into a horizontal orientation in order to align the substrate 156 with the horizontally orientated dryers 128. In one embodiment, once the substrate 156 has been processed through two brush box 126 operations, the substrate is inserted into the first available dryer unit 128.

As described earlier in reference to FIG. 1, the system enclosure is configured to comply with class 1 clean room specifications. Further, the filtration and laminar air flow create an environment which is progressively cleaner from the lower to the upper regions within the system enclosure. In one embodiment of the invention, as the substrate is processed, it is maintained in a progressively cleaner environment. Thus, after the scrub, polish, buff, or other such preparation in the brush boxes 126, the substrate 156 is lifted by the robot 140 into a cleaner environment for SRD processing in one of the two dryer units 128. Thus, the progressively cleaner environment is exploited by arranging the processing stations so that as the substrate is processed to a cleaner state, it is maintained in a cleaner environment.

In FIG. 5C, the robot 140 is shown transporting the substrate 156 to the output cassette 158 in accordance with one embodiment of the invention. Once the substrate 156 has been processed in one of the two dryer units 128, the substrate 156 is removed from the dryer unit 128 in a horizontal orientation, and transported across the system enclosure to an output cassette 158 which is at the same level as the dryer units 128. The processing of the substrate therefore remains in the cleanest upper regions of the system enclosure. As shown in FIG. 5C, the output shelf 118 is in the raised position, and a base 116 is positioned on the output shelf 118. An output cassette 158 is positioned on the base 116 and configured to receive the clean substrates 156. The robot 140 maintains the substrate in the horizontal orientation from the dryer 128 across the system enclosure, and inserts the horizontally oriented substrate 156 in the output cassette 158. Once the output cassette 158 is full of clean substrates 156, the output shelf 118 lowers into the lowered position. The output cassette 158, full of clean substrates 156, is unloaded from the system and replaced with an empty output cassette 158, and the shelf is raised into the raised position for a next batch of substrates 156.

In another embodiment, a SMIF pod 175 (see FIG. 9B) is positioned on the output shelf 118 instead of a base 116 and output cassette 158. The SMIF pod 175 is configured with an output cassette therein, and once the SMIF pod 175 is full of clean substrates 156, the output shelf 118 is lowered, the SMIF cover is attached to the SMIF pod 175, and the clean substrates 156 are maintained in the ultra-clean SMIF pod 175 environment.

Figure 6:
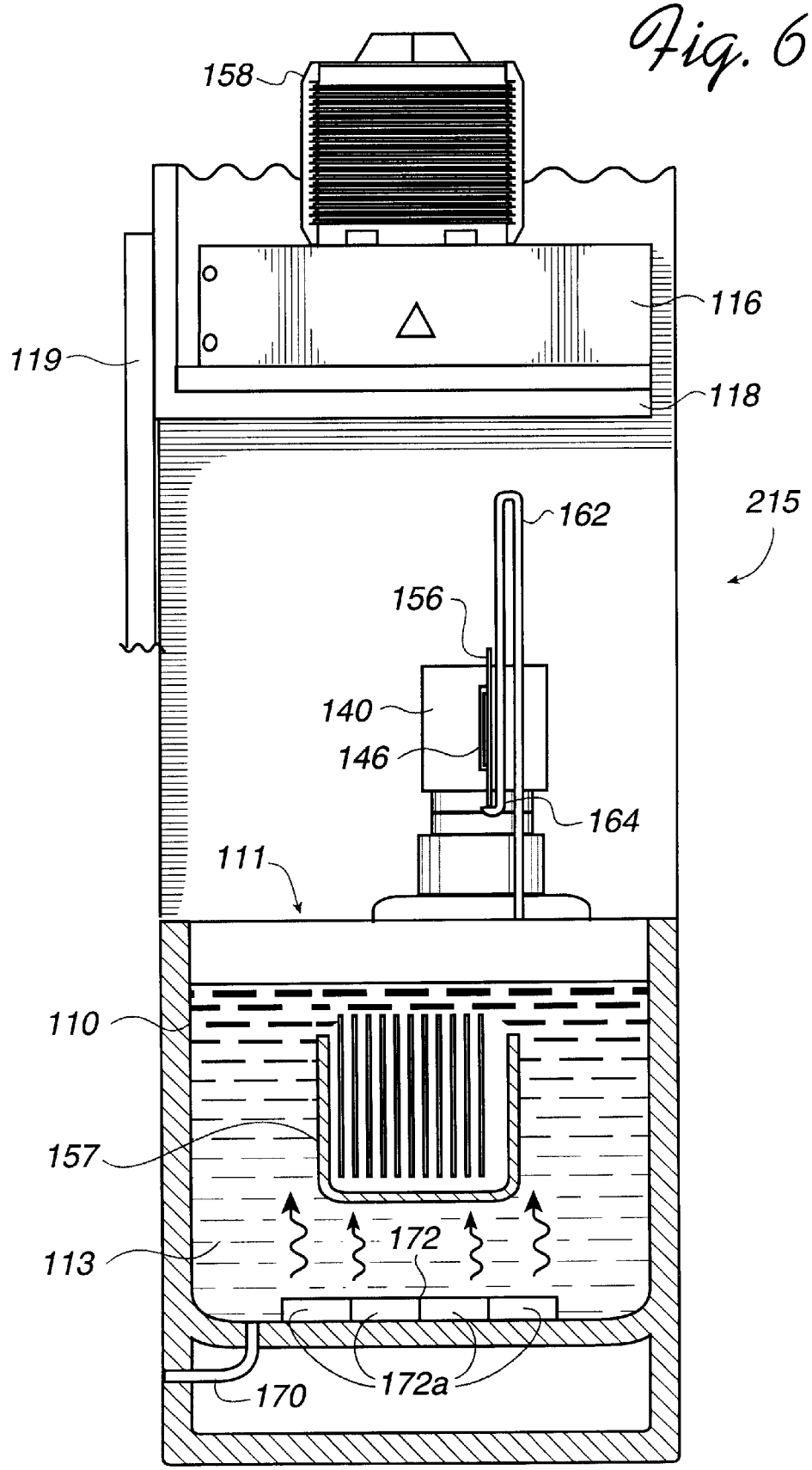
FIG. 6 shows a detail view of the immersion/load-unload subsystem in accordance with one embodiment of the invention.

FIG. 6 shows a detail view of the immersion/load-unload subsystem 215 in accordance with one embodiment of the invention. The immersion tank 110 in the illustrated embodiment provides a liquid bath 113 being of some chemical or water composition configured to loosen, soften, dislodge, or otherwise enhance the removal of residues, chemicals and particulates from substrates in the subsequent scrubbing, cleaning, polishing, buffing, or other such process. A drain 170 is provided with which to empty the immersion tank 110.

The embodiment illustrated in FIG. 6 includes a megasonic unit 172. The megasonic unit 172, in one embodiment, includes a plurality of megasonic elements 172a, and is configured in the bottom of the immersion tank 110. When a cassette of dirty substrates 157 is immersed in a bath 113 within the immersion tank 110, megasonic energy is generated by the megasonic unit 172 and is directed at the cassette of dirty substrates 157 through the bath 113. The intensity and duration of the megasonic energy is in accordance with process materials and requirements. By way of example, megasonic processing of semiconductor wafers can range between 2 minutes and 5 minutes, with a typical duration of at least 3 minutes.

FIG. 6 shows the output shelf 118 in the raised position. As described above in reference to FIG. 2, a cassette 158 for receiving clean substrates is positioned on a base 116 which is positioned on the output shelf 118. The output shelf 118 is raised along track 119 into the raised position. When the output shelf 118 is in the raised position, the tank opening 111 is unobstructed allowing access to introduce a cassette of dirty substrates 157 to be lowered into the immersion tank 110, and to extract substrates 156 one at a time from the immersion bath 113 for transfer to the brush box 126 (not shown in FIG. 6).

Figure 7:
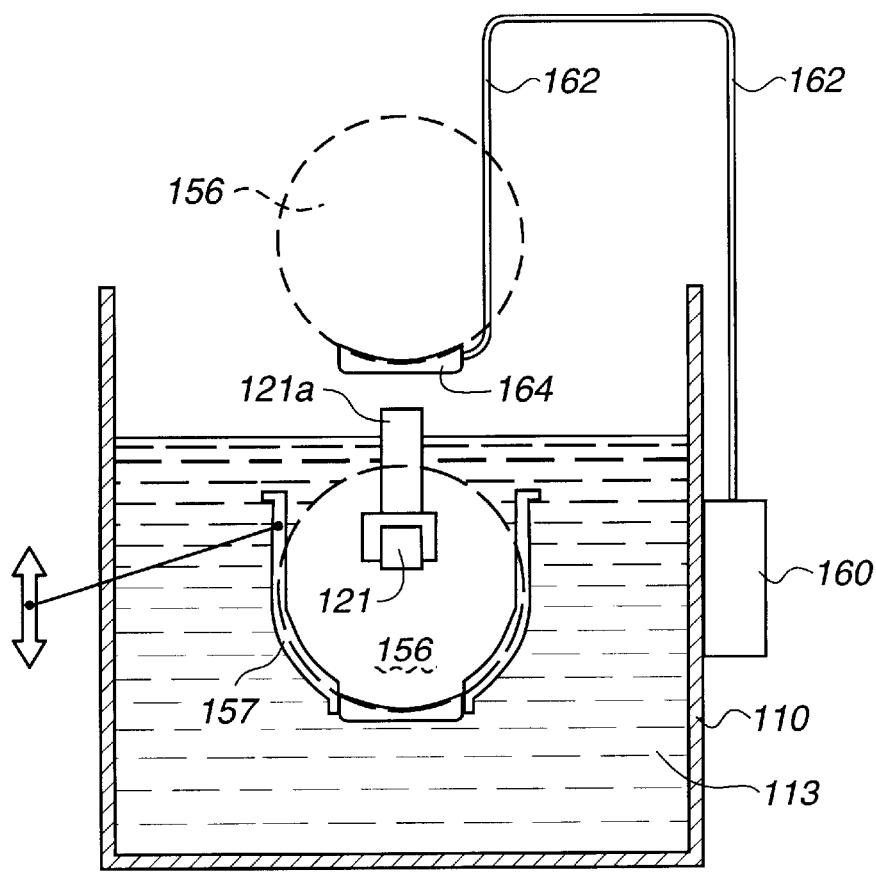
FIG. 7 is a side view of an immersion tank in accordance with one embodiment of the present invention.
Figure 8:
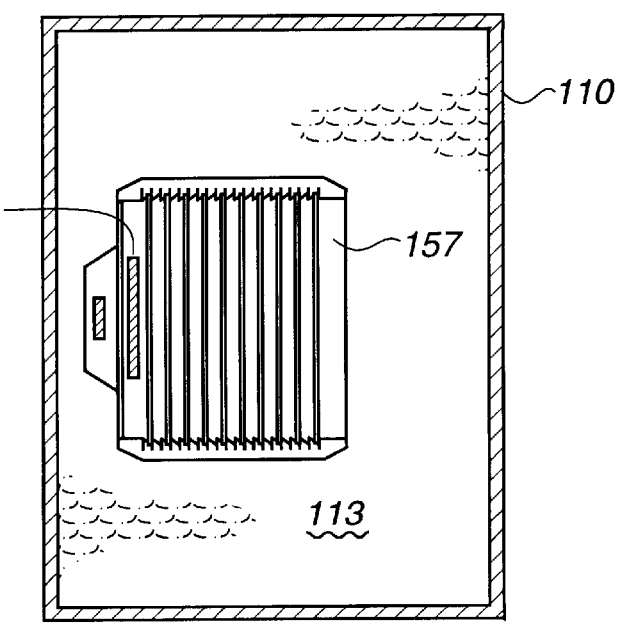
FIG. 8 is an overhead view of an immersion tank in accordance with one embodiment of the invention.

FIG. 6 shows a cassette of dirty substrates 157 in a bath 113 within the immersion tank 110. The immersion tank 110 is configured with a cassette hangar 121 with which to lower a cassette of dirty substrates 157 into the immersion tank 110, or raise an empty cassette out of the immersion tank 110. FIGS. 7 and 8 show perspective views of the immersion tank 110 in accordance with one embodiment of the invention, that more clearly illustrate the cassette hangar 121. FIG. 7 is a side view of an immersion tank 110. The cassette hangar 121 is attached to a hangar arm 121a. The cassette hangar 121 is configured to receive and support a cassette of substrates 157. The hangar arm 121a is configured to raise and lower the cassette hangar 121, thereby lowering a cassette of dirty substrates 157 into the immersion bath 113, and raise an empty cassette out of the immersion bath 113. The cassette hangar 121 is shown from an overhead perspective in FIG. 8 supporting a cassette of dirty substrates 157 in accordance with one embodiment of the invention.

Returning to FIG. 6, a picker 164 is shown attached to a picker arm 162. The picker arm is controlled by a motor (not shown) to raise, lower, and index the picker 164 in accordance with one embodiment of the invention. The motor might be a stepper motor, a servo motor, or other type of motor to provide precise control of the picker arm 162. In one embodiment of the invention, the picker arm 162 is configured on the exterior of the immersion tank 110 and constructed to insert the picker 164 into the immersion tank 110 to a level lower than the immersed substrates. Once the cassette of dirty substrates 157 has been lowered into the immersion tank 110, immersed in the bath 113 and subjected to megasonic processing, the picker arm 162 is maneuvered to insert the picker 164 into the bath 113 and into the cassette of dirty substrates 157 to a point lower than a first substrate. The picker 164 then indexes the picker 162 to a point under the first substrate and lifts the substrate out of the immersion tank 110. The picker arm 164 extracts the substrate 156 from the immersion tank 110 and lifts the substrate 156 into the space between the top of the tank 111 and the output shelf where it is retrieved by the robot 140. When the substrate 156 is extracted from the immersion tank 110, it is in a vertical orientation. The robot 140 maintains the vertical orientation of the substrate 156 while transporting the substrate 156 across the system enclosure and inserting the substrate 156 into the vertically oriented brush box 126 (not shown in FIG. 6).

The picker 162, picker arm 164 and motor 160 are further illustrated in the side view of FIG. 7. As described above, the illustrated embodiment includes a picker arm 162 configured along the outside of the immersion tank 110, controlled by the motor 160, and further configured to be inserted into the immersion tank 110 to obtain and extract a substrate 156.

Figure 9:
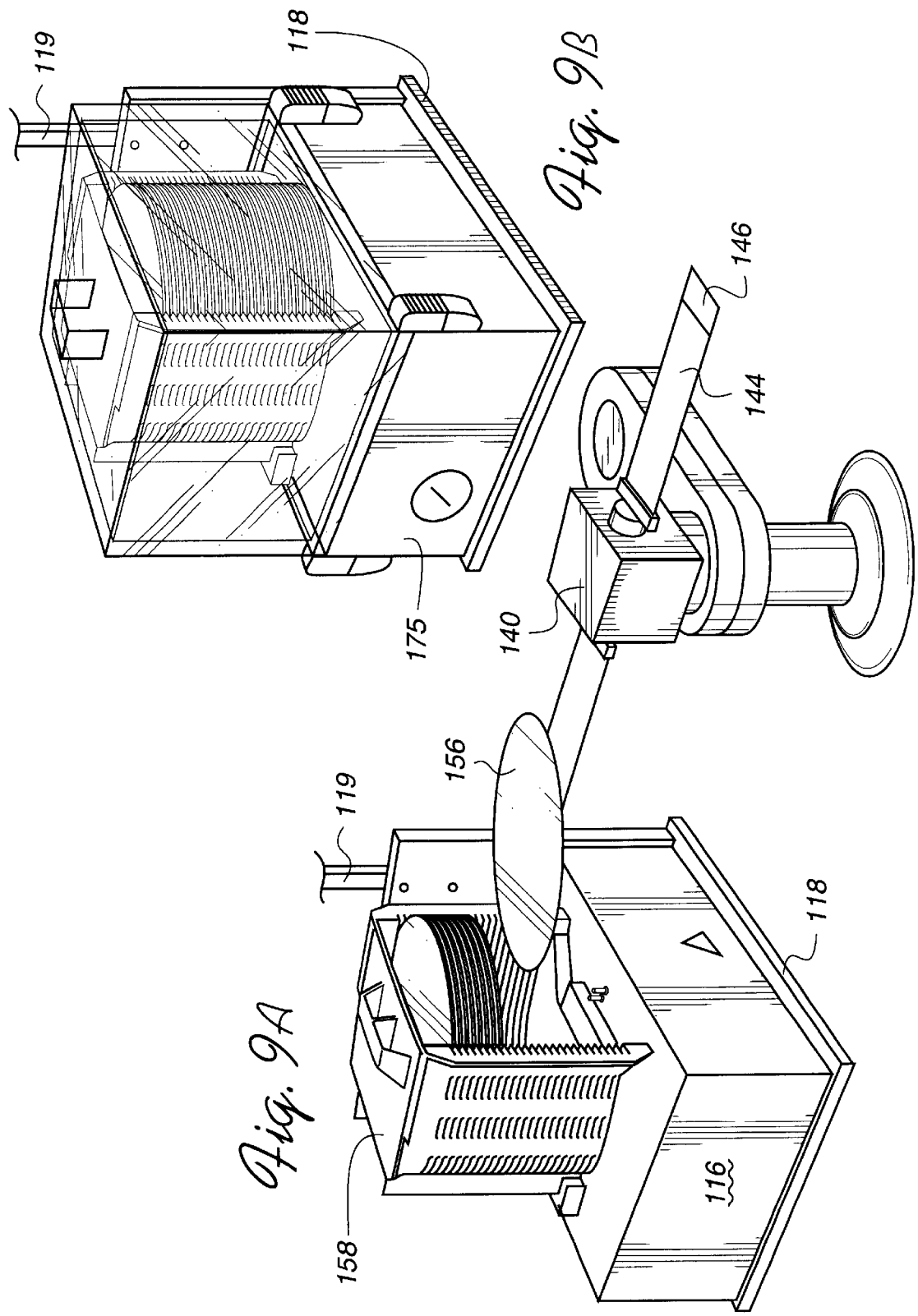
FIGS. 9A and 9B illustrate components for receiving output, clean, substrates in accordance with alternative embodiments of the invention.
Figure 10:
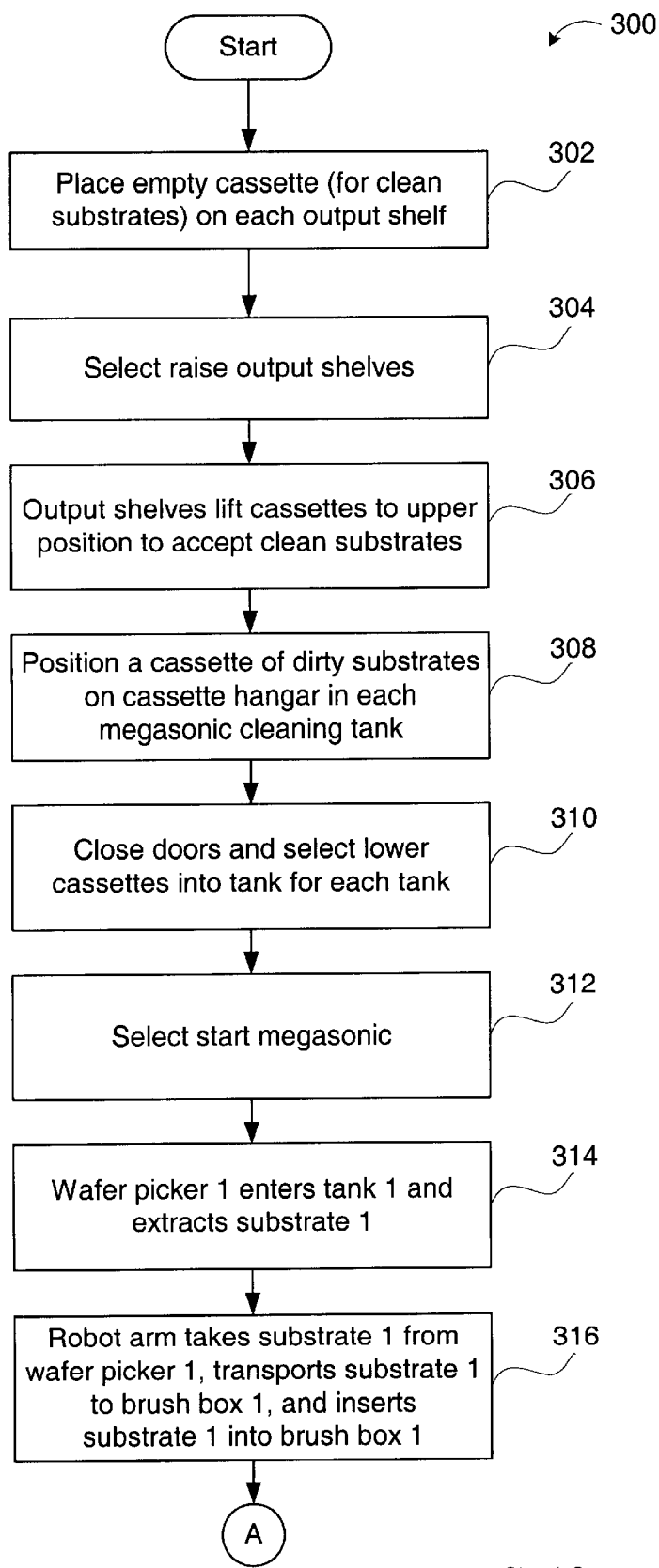
FIGS. 10–16 are a flow chart diagram illustrating the process flow operations in the implementation of one embodiment of the present invention.

FIGS. 9A and 9B illustrate components for receiving output, clean, substrates in accordance with alternative embodiments of the invention. In FIG. 9A, a base 116 with an output cassette 158 thereon is shown on output shelf 118. The output shelf 118 is positioned along track 119. A robot 140 is shown inserting a substrate 156 into the output cassette 158. As described above, the robot 140 is configured with two blades 144 extending in opposite directions from the robot 140. Each blade 144 has an end effector 146 at its distal end that is configured to position a substrate 156 of whatever type is being processed, and each blade 144 is configured to pivot to position the end effector 146 in either of a horizontal or vertical orientation.

FIG. 9B is an illustration of a SMIF pod 175 in accordance with one embodiment of the present invention. As described in detail above, the SMIF pod 175 is placed on output shelf 118 in the same manner as the base 116 and output cassette 158 shown in FIG. 9A. The dimensions of the SMIF pod 175 are such that a SMIF pod 175 provides an alternative embodiment for collecting output substrates without necessitating system configuration adjustments.

FIGS. 10–16 are a flow chart diagram 300 illustrating the process flow operations in the implementation of one embodiment of the present invention. The embodiment illustrated in the flow chart diagram 300 is illustrative of one application for the present invention. The application includes two brush box processes, followed by a single dryer unit operation. The dryer unit operation takes twice as long a time in duration as each brush box operation and, as will be seen, the process alternates between dryer units. When a first cassette is empty (e.g., all of the substrates from a first cassette of dirty substrates have been introduced into the process flow), the process begins processing a second cassette of substrates. The process maintains lot integrity in the preparation of cassettes of substrates and so all of the substrates removed from a first cassette of dirty substrates are inserted into a first clean output cassette.

The process begins with operation 302 in which empty cassettes, output cassettes, are placed on the output shelf. In one embodiment, a standard cassette is used, and a base is positioned on the output shelf. The output cassette is positioned on the base. In another embodiment, a SMIF pod, also known as a SMIF box, is utilized to maintain a portable, ultra-clean environment in which to store the substrates. If a SMIF pod or box is used, the SMIF pod or box is situated directly on the output shelf without an intervening base.

The process flow continues with operation 304 in which the operator selects raise output shelves from a process menu, and then with operation 306 in which the output shelves are raised into an upper or raised position placing the output cassette in position to accept clean substrates. As described above in reference to FIG. 1, one embodiment of the present invention provides a system monitor to enable integrated access, control, and indication of substrate processing and system operations. Such a system monitor may include menu driven process screens requiring operator input to proceed with substrate processing. By way of example, one menu may include selection of standard cassette or SMIF pod, whether or not the cassette is positioned on each of the output shelves, size and type of substrate, and other such information. The system monitor might provide a touch screen or light sensitive screen easily manipulated by an operator maintaining a clean room environment. Operation 306 is the input that positions the output shelves in the raised position, ready to accept clean substrates.

The process flow continues with operation 308 in which a cassette of dirty substrates (e.g., substrates to be processed through the claimed invention) is placed on a hangar in each of the immersion tanks. When the output shelf is in the raised position (operation 306), the top of the immersion tank is accessible to load cassettes of dirty substrates, and for extraction of the substrates during processing. A cassette of substrates is placed on a hangar in each immersion tank in operation 308, and then in operation 310, the operator closes the doors and selects lower cassette into tank for each immersion tank from the operation menu as described above. In one embodiment, a safety switch is provided on the doors so that no processing can occur within the system unless the doors are closed. Once the doors are closed and the operator selects the lower the cassette function, the system begins substrate processing by lowering the selected cassettes.

In operation 312, the operator selects start megasonic. As described above, one embodiment of the invention includes a megasonic energy operation on the substrates in preparation for a scrub, clean, polish, buff, or other similar processing of the substrates. The intensity and duration of the megasonic energy is process dependent, and in one embodiment, is system-program selected based on operator input of size and type of substrate being processed. As described above, an exemplary wafer substrate may require processing in the range of two to five minutes, with a preferred processing time of at least three minutes. Once the megasonic operation is accomplished, the wafers remain in the liquid bath in the immersion tank until extracted for further processing in accordance with an embodiment of the invention.

The process flow advances to operation 314 in which the wafer picker is inserted into immersion tank 1 and extracts substrate 1. Process flow diagram 300 illustrates a typical process flow in accordance with one embodiment of the invention through a representative first and second cassette of substrates in order to describe the processes of transitioning from a first cassette of dirty substrates to a second cassette of dirty substrates, removing a cassette of clean substrates, and introducing a third cassette of dirty substrates. The processing of substrates maintains lot integrity such that all of the substrates removed from a cassette of dirty substrates are placed in the same clean output cassette, and so source and destination locations are specified throughout the process flow diagram 300.

The process flow continues with operation 316 and the robot arm taking substrate 1 from the wafer picker, transporting the substrate to brush box 1, and inserting substrate 1 into brush box 1. Until at least 4 substrates are in the process flow following megasonic processing, there is some wait time between processing operations in the illustrated embodiment. When at least 4 substrates are in the process flow, the wait is obviated by performing parallel operations with multiple substrates. Following operation 316, the process flow continues through connector "A" to FIG. 11.

Figure 11:
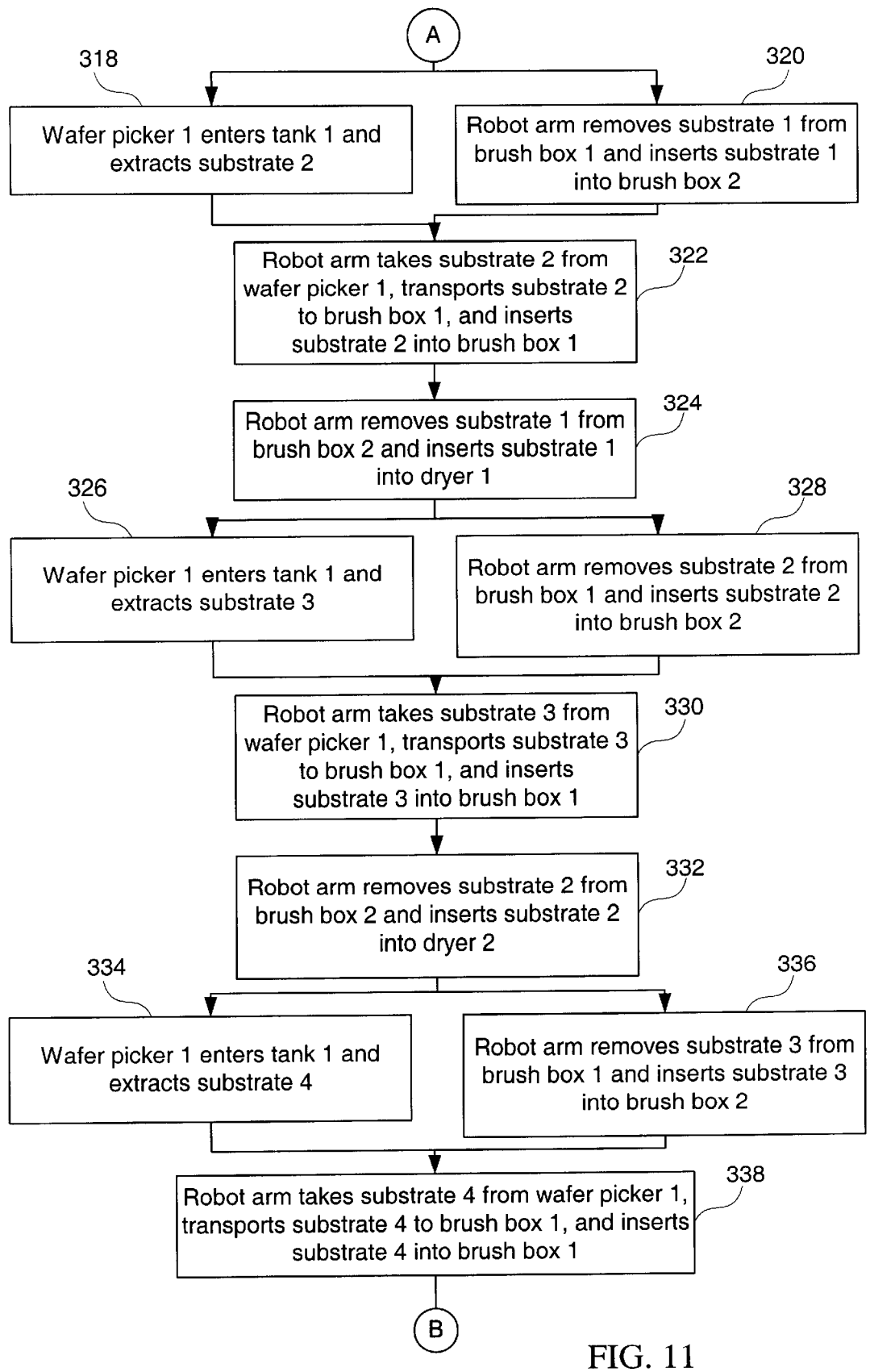

In FIG. 11, the process flow continues with parallel operations 318 and 320. In process 318, the wafer picker enters tank 1 and extracts substrate 2 to introduce the second substrate into the process flow. The simultaneous operation 320 is the robot arm removing substrate 1 from brush box 1, and then inserting substrate 1 into brush box 2. As described above, the illustrated process flow includes two separate brush box operations, and so each substrate will be processed by brush box 1 followed by brush box 2. In another embodiment, each substrate may be processed by a single brush box operation, and then processed through the dryer unit. In such an embodiment, parallel operations can be programmed within the processing system so that substrates might flow from tank 1 to brush box 1 to dryer 1 to output cassette 1, and simultaneously from tank 2 to brush box 2 to dryer 2 and to output cassette 2. In this alternative embodiment, a second robot may be configured for more efficient process flow.

The illustrated process continues with operation 322 in which the robot takes substrate 2 from the wafer picker, transports it to brush box 1, and inserts substrate 2 into brush box 1. Next, in operation 324, the robot arm removes substrate 1 from brush box 2, raises it to the level of the dryer units and flips the substrate horizontal, and then inserts substrate 1 into dryer unit 1. As described in detail above, one embodiment of the claimed invention is configured to create an environment within the system that is progressively cleaner at higher levels. The transfer of a substrate from the brush box level to the dryer level is the transfer of a substrate to a higher level within the system, and thus transfer to a cleaner environment. A substrate processed through two brush box operations is cleaner than prior to processing, and is thus a cleaner substrate being transferred into a cleaner environment.

The process continues with parallel operations 326 and 328. While the wafer picker extracts substrate 3 from tank 1 in operation 326, the robot arm removes substrate 2 from brush box 1 and inserts it into brush box 2 in operation 328. Next, in operation 330, the robot arm takes substrate 3 from the wafer picker, transports it to brush box 1, and then inserts substrate 3 into brush box 1. The robot arm then moves to brush box 2 in operation 332 and removes substrate 2 from brush box 2, raises it to the dryer level, and then inserts substrate 2 into dryer 2.

Parallel operations 334 and 336 are next in the process flow with the wafer picker extracting substrate 4 from tank 1 in operation 334, and the robot arm transferring substrate 3 from brush box 1 to brush box 2 in operation 336. The robot arm then takes substrate 4 from the wafer picker, transports the substrate to brush box 1, and inserts substrate 4 into brush box 1. The process continues through connector "B" to FIG. 12. At the completion of operation 338, substrate 1 is in dryer 1, substrate 2 is in dryer 2, substrate 3 is in brush box 2, and substrate 4 is in brush box 1.

Figure 12:
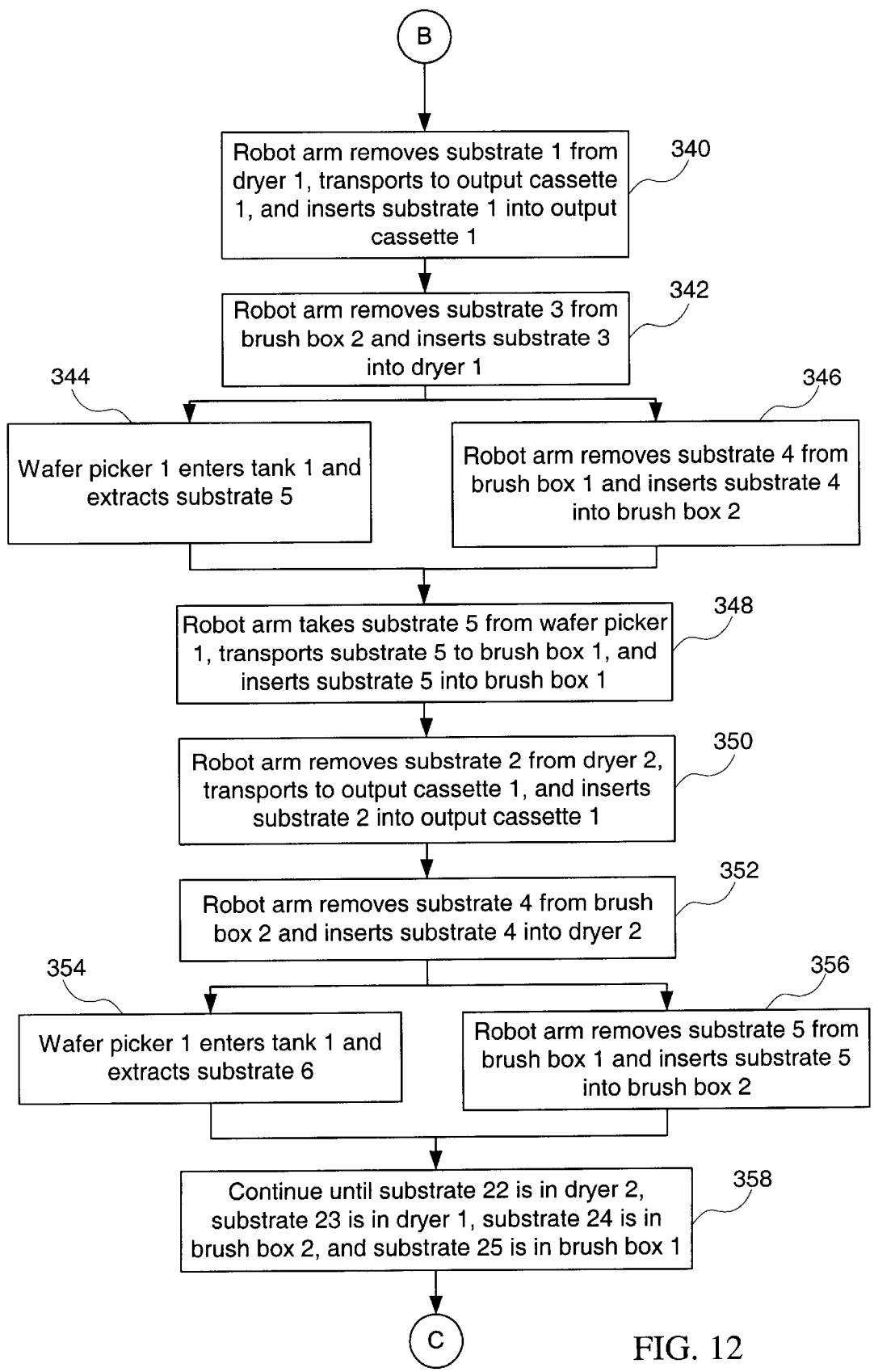

In FIG. 12, the process continues through connector "B" with operation 340 in which the robot arm removes substrate 1 from dryer 1, transports it across the system enclosure to output cassette 1, and inserts substrate 1 into output cassette 1. In operation 342, the robot arm moves substrate 3 from brush box 2 into dryer 1. Then, while the wafer picker is extracting substrate 5 from tank 1 in operation 344, the robot arm moves substrate 4 from brush box 1 to brush box 2 in operation 346.

The process continues with the robot taking substrate 5 from the wafer picker and inserting it into brush box 1 in operation 348, the robot taking substrate 2 from dryer 2, transporting it to output cassette 1 and inserting substrate 2 into output cassette 1 in operation 350, and then moving substrate 4 from brush box 2 up to dryer 2 in operation 352. In parallel operations 354 and 356, the wafer picker extracts substrate 6 from tank 1 while the robot moves substrate 5 from brush box 1 to brush box 2.

As indicated by operation 358, the above-described pattern and flow continues until substrate 22 is in dryer 2, substrate 23 is in dryer 1, substrate 24 is in brush box 2, and substrate 25 is in brush box 1. At this point, the process flow continues through connector "C" to FIG. 13 where the process flow switches from tank 1 to tank 2, and prepares to remove a clean output cassette and introduce a new cassette of dirty substrates.

Figure 13:
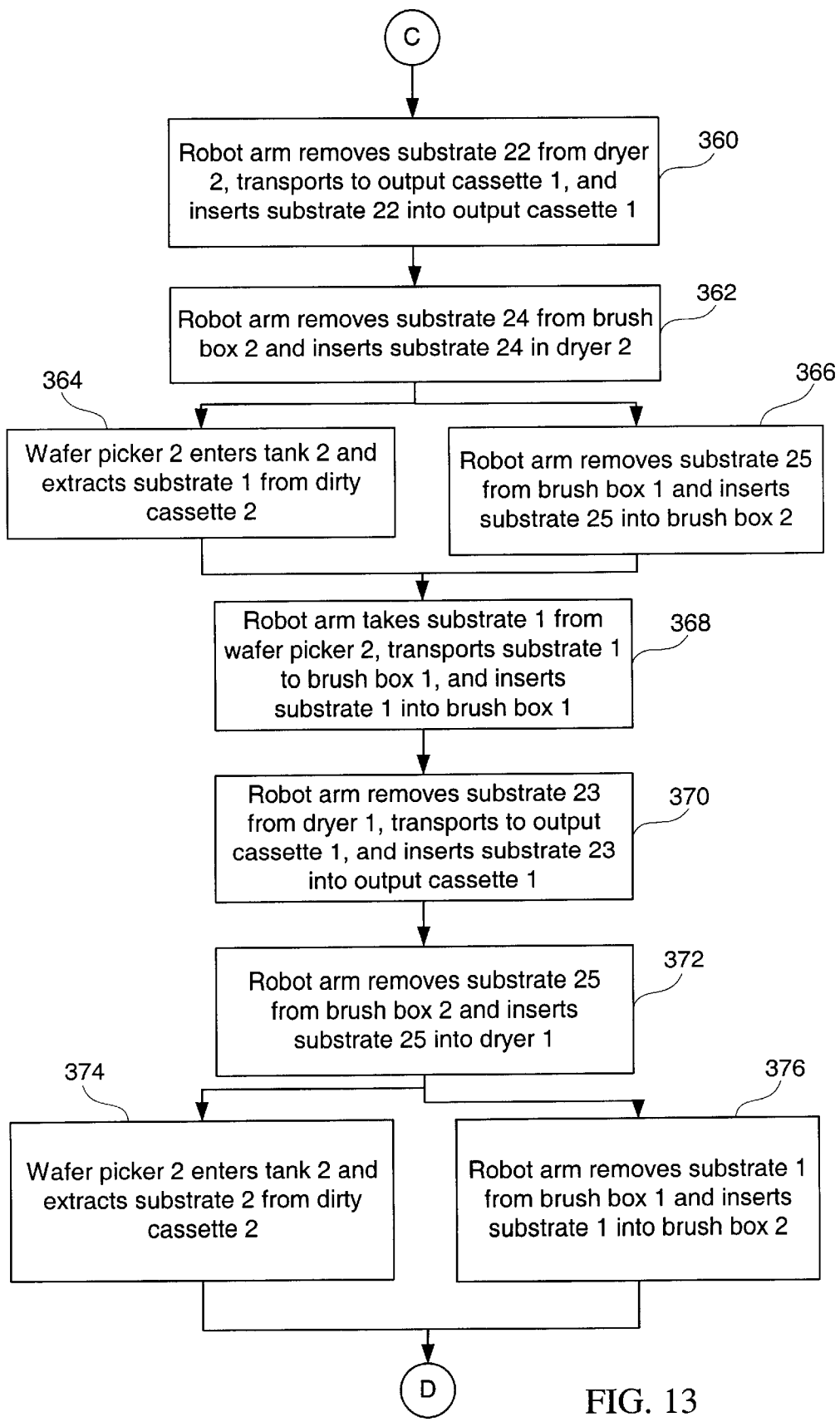

FIG. 13 shows the continuation of flow chart diagram 300 of the process flow operations in the implementation of one embodiment of the present invention. Continuing through connector "C", the robot arm removes substrate 22 from dryer 2, transports substrate 22 across the system enclosure to output cassette 1 and inserts substrate into output cassette 1 in operation 360. Next, in operation 362, the robot arm removes substrate 24 from brush box 2 and inserts it into dryer 2. While the robot arm then moves substrate 25 from brush box 1 to brush box 2 in operation 366, wafer picker 2 enters tank 2 and extracts substrate 1 from dirty cassette 2 in operation 364.

Next, the process proceeds with operation 368 where the robot arm takes substrate 1 from wafer picker 2, transports it to brush box 1 and inserts substrate 1 into brush box 1. The robot arm then removes substrate 23 from dryer 1 and inserts it into output cassette 1 in operation 370, and then moves substrate 25 from brush box 2 and inserts it into dryer 1 in operation 372. As the wafer picker 2 extracts substrate 2 from dirty cassette 2 in operation 374, the robot arm moves substrate 1 from brush box 1 to brush box 2 in operation 376. The process continues through connector "D" to FIG. 14.

Figure 14:
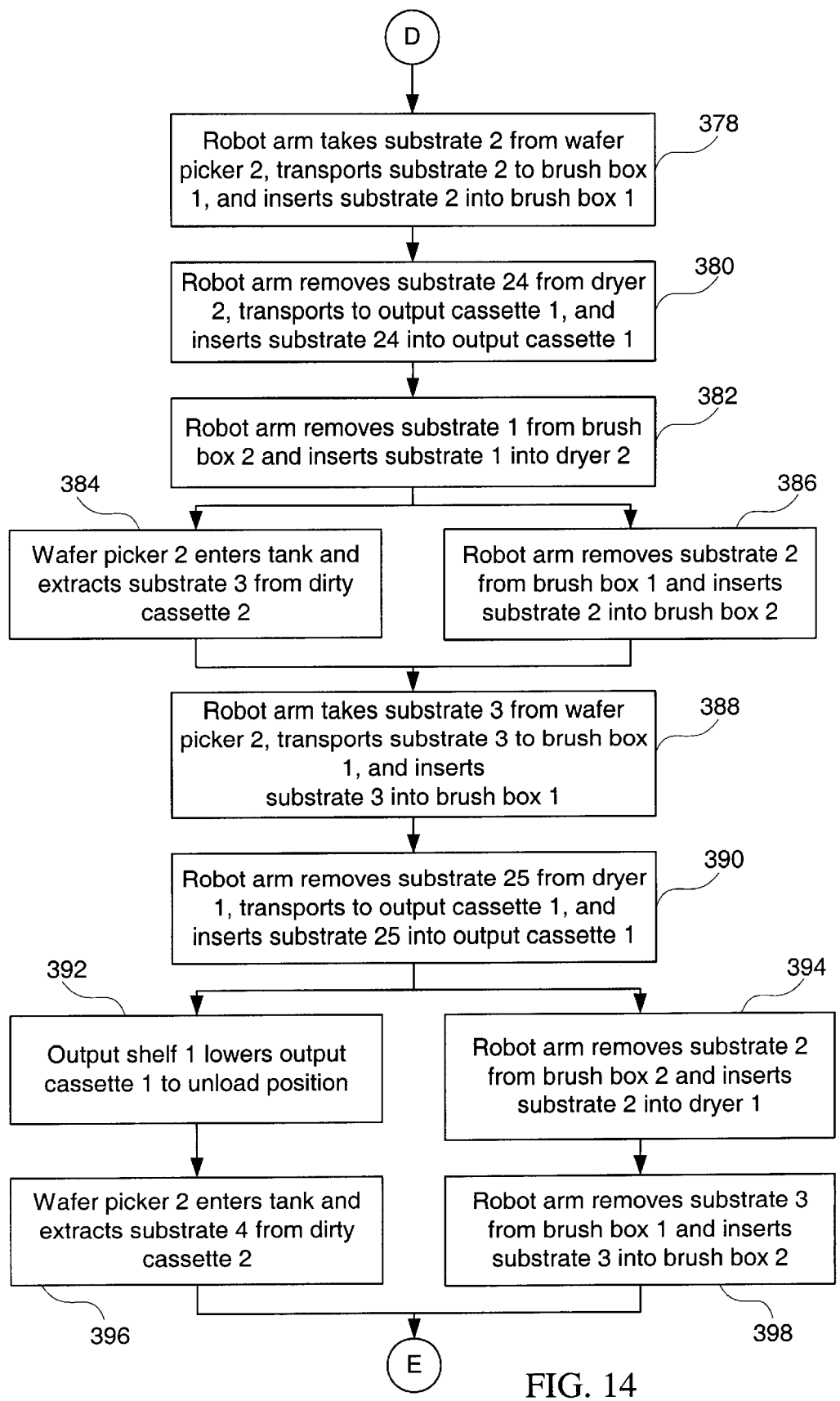

In FIG. 14, the process continues through connector "D" to operation 378 where the robot arm takes substrate 2 from wafer picker 2, transports it to brush box 1 and inserts substrate 2 into brush box 1. The robot arm then removes substrate 24 from dryer 2 and inserts it into output cassette 1 in operation 380, and then moves substrate 1 from brush box 2 to dryer 2 in operation 382. The process continues with parallel operations 384 and 386 and the wafer picker 2 extracting substrate 3 from dirty cassette 2 while the robot arm moves substrate 2 from brush box 1 to brush box 2. In operation 388, the robot arm takes substrate 3 from wafer picker 2 and inserts it in brush box 1, and in operation 390 the robot arm moves substrate 25 from dryer 1 to output cassette 1.

At the completion of operation 390, one complete cassette (in accordance with a 25-substrate cassette embodiment) of substrates has been processed in accordance with one embodiment of the claimed invention. The continued processing of substrates switched from one immersion tank and cassette of substrates to the other, the first output cassette is ready to be removed from the system and another cassette of dirty substrates can be introduced.

The process continues with parallel operations 392 and 394, followed by parallel operations 396 and 398. In operation 392, output shelf 1 lowers output cassette 1 to the lowered or load/unload position. In operation 394, the robot arm moves substrate 2 from brush box 2 to dryer 1. Next, in operation 396, the wafer picker 2 removes substrate 4 from dirty cassette 2. Simultaneously, the robot arm is moving substrate 3 from brush box 1 to brush box 2. Since the process has transitioned from the first immersion tank to the second immersion tank, output shelf 1 with the full cassette of processed substrates can be positioned in the lowered position without interfering with the continued processing of substrates being extracted from immersion tank 2. The process continues through connector "E" to FIG. 15.

Figure 15:
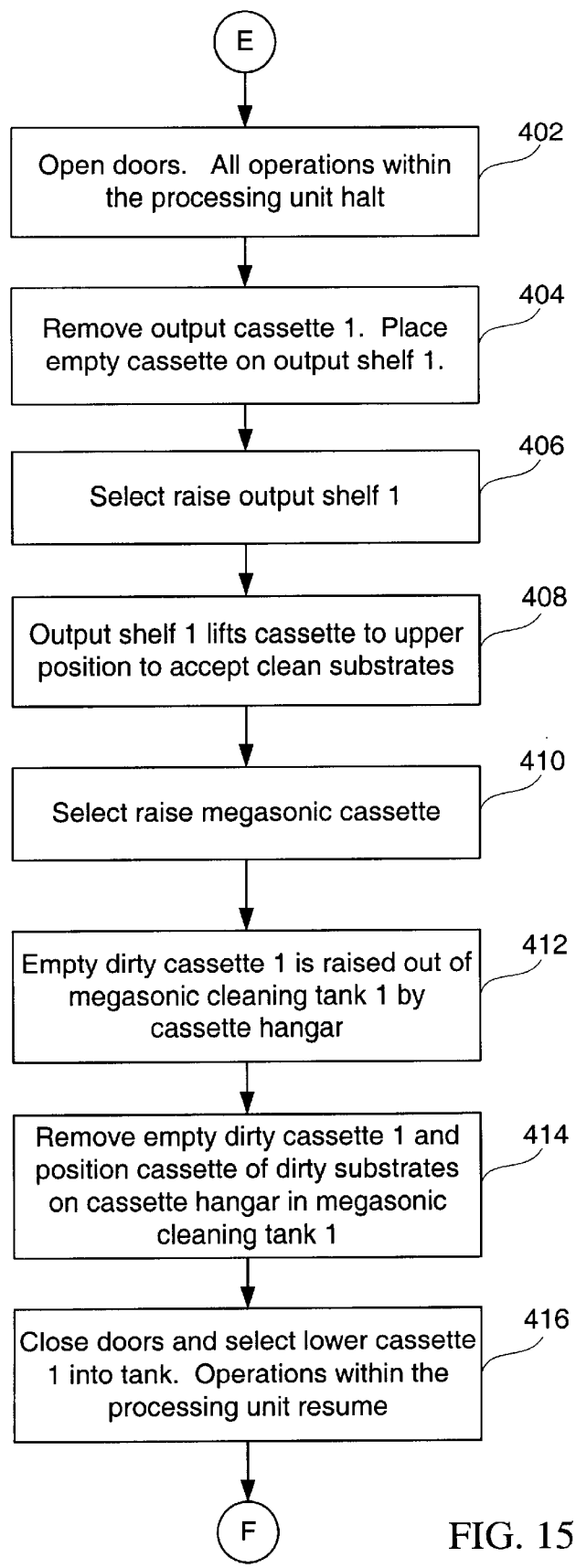
Figure 16:
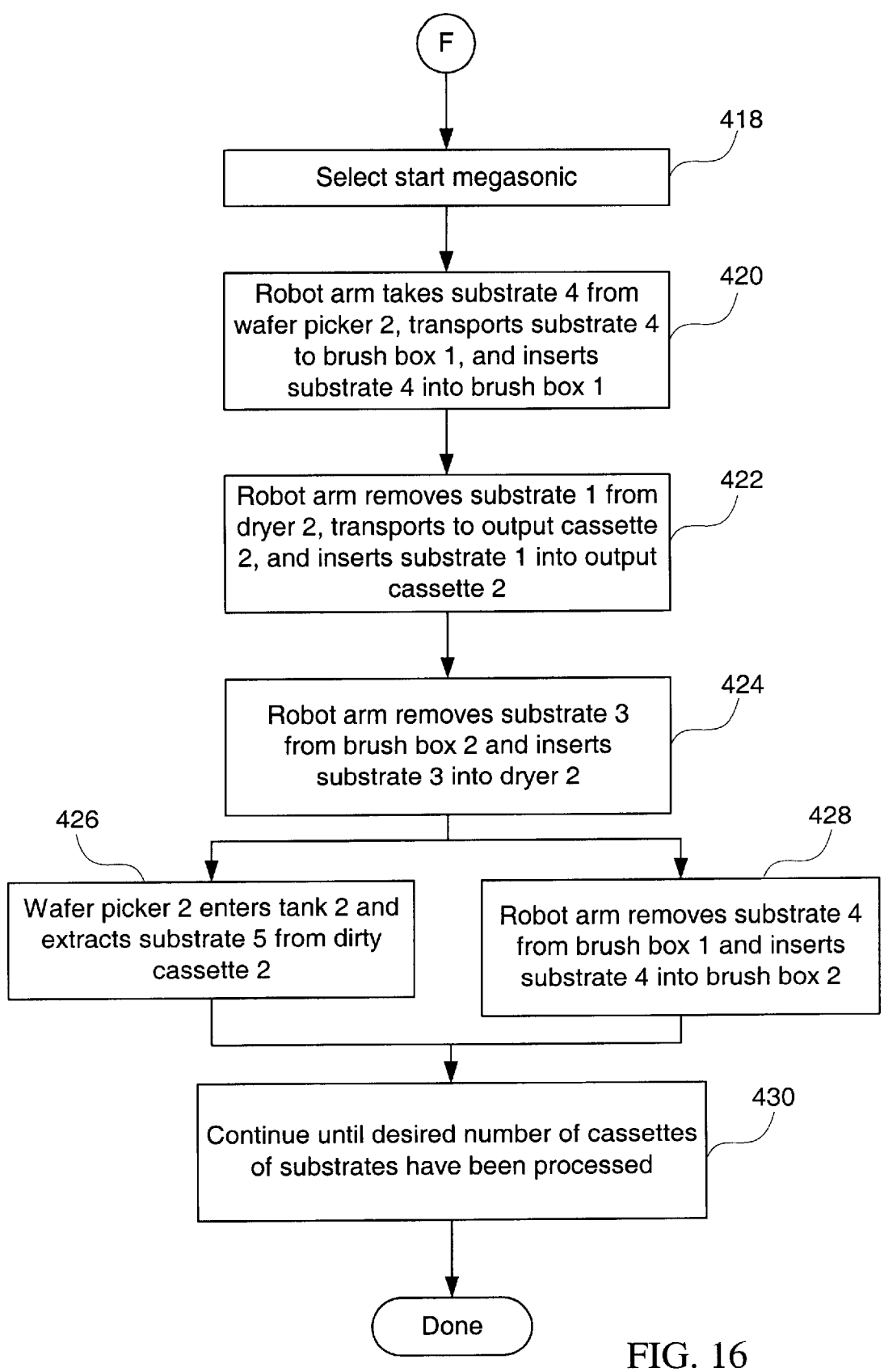

FIG. 15 shows the process continuing through connector "E" with operation 402 and the doors being opened. As described above, one embodiment of the present invention includes a safety switch in the doors so that no processing can occur when the system enclosure is breached. With the doors open and all operations stopped, output cassette 1, now full of processed substrates, is removed and an empty output cassette is replaced on output shelf 1. In one embodiment, an operator selects raise output shelf 1 from a process menu in operation 406, and the output shelf raises the output cassette to the raised position in operation 408, once again granting access to the top of immersion tank 1. In operation 410, the operator selects raise megasonic cassette, and in operation 412 the empty dirty cassette 1 is lifted out of the bath in immersion tank 1 by the cassette hangar. The empty dirty cassette 1 is then replaced with a new cassette full of dirty substrates in operation 414, and in operation 416 the doors are closed, the new cassette lowered into immersion tank 1, and all operations within the system enclosure resume. The operation proceeds through connector "F" to FIG. 15.

FIG. 15 shows the final steps of the process flow in transitioning from output cassette 1 to output cassette 2 and the seamless continuation of substrate processing through as many cassettes of substrates as desired. The process flow continues through connector "F" to operation 418 and selecting start megasonic in immersion tank 1 for the cassette introduced in operations 414 and 416. In operation 420 the robot arm resumes the movement of substrates through the process flow with taking substrate 4 from wafer picker 2 and inserting it into brush box 1. The robot then moves substrate 1 from dryer 2 to output cassette 2 in operation 422, moves substrate 3 from brush box 2 into dryer 2 in operation 424, and then, while the wafer picker 2 is extracting substrate 5 from dirty cassette 2 in operation 426, the robot moves substrate 4 from brush box 1 to brush box 2 in operation 428.

As indicated by operation 430, the method continues the above described cycle and flow, transitioning between immersion tanks and maintaining lot integrity until the desired number of substrates have been processed, and the method is done. As described above, the illustrated method is one of a plurality of possible methods and configurations that can easily be modified to rapidly and efficiently process substrates in accordance with specific fabrication needs.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. In an integrated substrate processing system, a substrate immersion tank and load/unload station, comprising:
   an immersion tank configured to receive a plurality of substrates in a liquid bath;
   a cassette hangar configured to receive the plurality of substrates in a location exterior to the immersion tank and configured to position the plurality of substrates in the liquid bath;

a substrate picker configured to extract the plurality of substrates one at a time from the liquid bath and position each one of the plurality of substrates exterior to the immersion tank, the positioning configured to enable each one of the plurality of substrates to be received by a substrate robot; and a substrate output shelf positioned over the immersion tank and configured to receive the plurality of substrates after processing in the integrated substrate processing system, to position the plurality of substrates for removal from the integrated substrate processing system, and to be positioned to provide access to the immersion tank for receiving the plurality of substrates.

2. The substrate immersion tank and load/unload station of claim 1, wherein the immersion tank includes a plurality of megasonic elements configured to transmit megasonic energy through the liquid bath for processing the plurality of substrates.

3. The substrate immersion tank and load/unload station of claim 2, wherein the plurality of substrates received by the cassette hangar are contained within a substrate cassette, the substrate cassette being configured to attach to the cassette hangar, and the cassette hangar being configured to lower the substrate cassette containing the plurality of substrates into the liquid bath in the immersion tank.

4. The substrate immersion tank and load/unload station of claim 3 wherein the substrate picker is configured to provide a narrow scoop-shaped arm capable of being inserted into the substrate cassette adjacent to and extending below each one of the plurality of substrates, one-at-a-time, the substrate picker being further configured to index into position to support each one of the plurality of substrates, one-at-a-time, and to extract each one of the plurality of substrates, one-at-a-time from within the cassette in the fluid bath in the immersion tank.

5. The substrate immersion tank and load/unload station of claim 1, wherein the substrate output shelf is configured to be in one of a lowered position and a raised position, the substrate output shelf being in the raised position is configured to receive processed substrates from the substrate transfer robot and provides access to the immersion tank in order to receive substrates to be processed.

6. The substrate immersion tank and load/unload station of claim 5, wherein the substrate output shelf is configured to support a substrate output cassette, and the substrate output cassette is configured to receive processed substrates from the substrate transfer robot when the output shelf is in the raised position.

7. The substrate immersion tank and load/unload station of claim 5, wherein the substrate output shelf is configured to support a SMIF pod, and the SMIF pod is configured to receive processed substrates from the substrate transfer robot when the output shelf is in the raised position.

* * * * *